(12) United States Patent
Liu et al.

(10) Patent No.: US 8,227,023 B1
(45) Date of Patent: Jul. 24, 2012

(54) METHOD AND SYSTEM FOR FABRICATING MAGNETIC TRANSDUCERS WITH IMPROVED PINNING

(75) Inventors: Feng Liu, San Ramon, CA (US); Prakash Mani, Fremont, CA (US); Christian Kaiser, San Jose, CA (US); Laurence L. Chen, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 517 days.

(21) Appl. No.: 12/472,965

(22) Filed: May 27, 2009

(51) Int. Cl.
*G11B 5/127* (2006.01)
(52) U.S. Cl. .................... 427/127; 360/324.1
(58) Field of Classification Search ........... 427/127, 427/128, 129, 130, 131, 132; 360/324.1, 360/327.1, 325, 327.21, 324.12
See application file for complete search history.

(56) References Cited

U.S. PATENT DOCUMENTS

| | | | |
|---|---|---|---|
| 5,638,235 A | 6/1997 | Gill et al. | |
| 5,640,753 A | 6/1997 | Schultz et al. | |
| 5,666,246 A | 9/1997 | Gill et al. | |
| 6,151,193 A | 11/2000 | Terunuma et al. | |
| 6,271,997 B1 | 8/2001 | Gill | |
| 6,317,290 B1 | 11/2001 | Wang et al. | |
| 6,400,536 B1 | 6/2002 | Gill | |
| 6,447,935 B1 | 9/2002 | Zhang et al. | |
| 6,449,131 B2 | 9/2002 | Guo et al. | |
| 6,618,223 B1 | 9/2003 | Chen et al. | |
| 6,721,146 B2 | 4/2004 | Beach | |
| 6,738,237 B2 | 5/2004 | Gill | |
| 6,764,778 B2 | 7/2004 | Saito et al. | |
| 6,866,751 B2 | 3/2005 | Gill et al. | |
| 7,061,731 B2 | 6/2006 | Larson et al. | |
| 7,161,763 B2 | 1/2007 | Ho et al. | |
| 7,180,715 B2 | 2/2007 | Gill | |
| 7,230,845 B1 | 6/2007 | Wang et al. | |
| 7,411,765 B2 | 8/2008 | Childress et al. | |
| 7,423,849 B2 | 9/2008 | Gill | |
| 7,446,986 B2 | 11/2008 | Araki et al. | |
| 7,522,391 B2 | 4/2009 | Freitag et al. | |
| 2001/0021087 A1 | 9/2001 | Guo et al. | |
| 2003/0179500 A1 | 9/2003 | Gill et al. | |
| 2003/0179512 A1 | 9/2003 | Ju et al. | |
| 2004/0008536 A1 | 1/2004 | Garni et al. | |
| 2005/0018364 A1 | 1/2005 | Gill | |

(Continued)

OTHER PUBLICATIONS

H. Jaffres, et al., "Angular dependence of the tunnel magnetoresistance in transition-metal-based junctions", Physical Review B, vol. 64, 064427 (2001), 7 pages.

*Primary Examiner* — Michael Cleveland
*Assistant Examiner* — Tabassom Tadayyon Eslami

(57) ABSTRACT

A method and system for providing a magnetic transducer are disclosed. The method and system include providing a magnetic element including a free layer, a nonmagnetic spacer layer, a pinned layer, and a pinning layer adjacent to the pinned layer. The free layer is to be biased in a first direction. The pinning layer biases the pinned layer magnetization in a second direction. The pinning layer is oriented along the second direction. A hard bias structure is adjacent to the magnetic element. The hard bias structure magnetization is initialized such that it has a nonzero component along the second direction. The method and system also include performing thermal treatment(s) after initializing the hard bias magnetization. The thermal treatment(s) are above room temperature. The method and system further include resetting the hard bias magnetization substantially along the first direction after the thermal process(es) are performed.

18 Claims, 6 Drawing Sheets

U.S. PATENT DOCUMENTS

| | | |
|---|---|---|
| 2006/0028862 A1 | 2/2006 | Min et al. |
| 2006/0077707 A1 | 4/2006 | Deak |
| 2006/0198185 A1 | 9/2006 | Hiebert et al. |
| 2006/0291107 A1 | 12/2006 | Sbiaa et al. |
| 2007/0019338 A1* | 1/2007 | Childress et al. .......... 360/324.1 |
| 2007/0133133 A1 | 6/2007 | Freitag et al. |
| 2008/0273380 A1 | 11/2008 | Diao et al. |
| 2009/0002898 A1* | 1/2009 | Childress et al. .......... 360/324.1 |

* cited by examiner

METHOD AND SYSTEM FOR FABRICATING MAGNETIC TRANSDUCERS WITH IMPROVED PINNING

BACKGROUND

FIG. 1 is a flow chart depicting a conventional method 10 for fabricating a conventional magnetoresistive (MR) sensor. For simplicity, some steps are omitted. The conventional method 10 is used for providing a giant magnetoresistive (GMR) sensor, such as a spin valve or spin tunneling junction. The MR stack is provided, via step 12. Step 12 typically includes blanket depositing the layers of the MR sensor. For example, seed layers, an antiferromagnetic (AFM) layer, a pinned layer such as a synthetic antiferromagnetic (SAF) layer, a nonmagnetic spacer layer, a ferromagnetic or SAF free layer, and capping layer(s) may be blanket deposited in step 12. The conventional MR sensor is defined at least in the track width direction, via step 14. Typically, this is accomplished by covering a portion of the MR stack and milling away an exposed portion of the conventional MR stack using a conventional ion mill.

Hard bias structures are provided, via step 16. Step 16 is typically performed by blanket depositing the hard bias material, then removing the mask on the conventional MR sensor. The hard bias structures are typically high coercivity materials. Thus, once their magnetization is set in a particular direction, magnetization of the hard bias layers should remain stable. The magnetization of the hard bias is set in the direction desired for biasing the free layer, via step 18. Step 18 thus includes subjecting the transducer being fabricated to a large field along the easy axis of the free layer. For example, fields of approximately one Tesla may be applied in a desired direction along the easy axis of the free layer.

After the hard bias structures have been provided, the transducer is still subject to subsequent processing. Thus, for example, a photoresist layer is provided, via step 20. Step 20 may include spinning coating or otherwise depositing the photoresist layer. The photoresist is then cured, via step 22. Consequently, the transducer is subject to an elevated temperature, often for long times. For example, in some cases, the photoresist cure is at temperatures on the order of two hundred degrees centigrade for times on the order of seven to eight hours.

Fabrication of the conventional transducer may then be completed, via step 24. Step 24 may include exposing the photoresist layer to form a mask, and other processing. For example, shield(s), a write transducer, and/or other structures may be formed. In addition, other high temperature processes may be performed.

FIG. 2 depicts a portion of a conventional read transducer 50 fabricated using the conventional method 10. FIG. 2 depicts the conventional read transducer 50 from the air-bearing surface (ABS). Thus, a read sensor 52 including AFM layer 54, SAF layer 56, nonmagnetic spacer layer 58, free layer 60, and capping layer 62. In addition, hard bias structures 64 are shown. The hard bias structures 64 have had their magnetizations 65 set in step 18. In this state, the conventional transducer may go through the photoresist cure in step 22 and other high temperature steps.

Although the conventional method 10 may provide the conventional read transducer 50, there are drawbacks. In particular, the MR sensor 52 may have an undesirable amount of noise. In particular, the signal-to-noise ratio (SNR) of the MR sensor 52 may be degraded.

Accordingly, what is needed is an improved method for fabricating a MR sensor 52 having hard bias structures 64 with acceptable SNR.

SUMMARY

A method and system for providing a magnetic transducer are disclosed. The method and system include providing a magnetic element including a free layer, a pinned layer, a nonmagnetic spacer layer between the free and pinned layers, and a pinning layer adjacent to the pinned layer. The free layer is configured to be biased in a first direction. The pinned layer has a pinned layer magnetization biased by the pinning layer in a second direction. The pinning layer is oriented along the second direction. A hard bias structure is provided adjacent to the magnetic element and has a hard bias magnetization. The hard bias magnetization is initialized such that a first component of the hard bias magnetization is along the first direction, while a second, nonzero component of the hard bias magnetization is along the second direction. The method and system also include performing at least one thermal treatment after the step of initializing the hard bias magnetization. The thermal treatment(s) are above room temperature. The method and system further include resetting the hard bias magnetization substantially along the first direction after the at least one thermal process is performed.

DETAILED DESCRIPTION OF THE PREFERRED EMBODIMENTS

As discussed above, a conventional MR sensor 52 may suffer from a degraded SNR. It has been determined that this loss in SNR may be due to canting of the SAF from the desired magnetization direction. It has also been determined that this canting and SNR reduction may be due to a reduction in the coupling field of the AFM 54. More specifically, fields due to the hard bias structures during fabrication may result in canting of the pinned and reference layers. Micromagnetic modeling indicates that this canting is not uniform, varies across the sensor and is due to the hard bias field. Further, heat treatments, such as a photoresist cure, may exacerbate a loss of SNR due to increases in the distribution of the orientations of the AFM and/or canting of the magnetic layers of the SAF.

Figure 1:
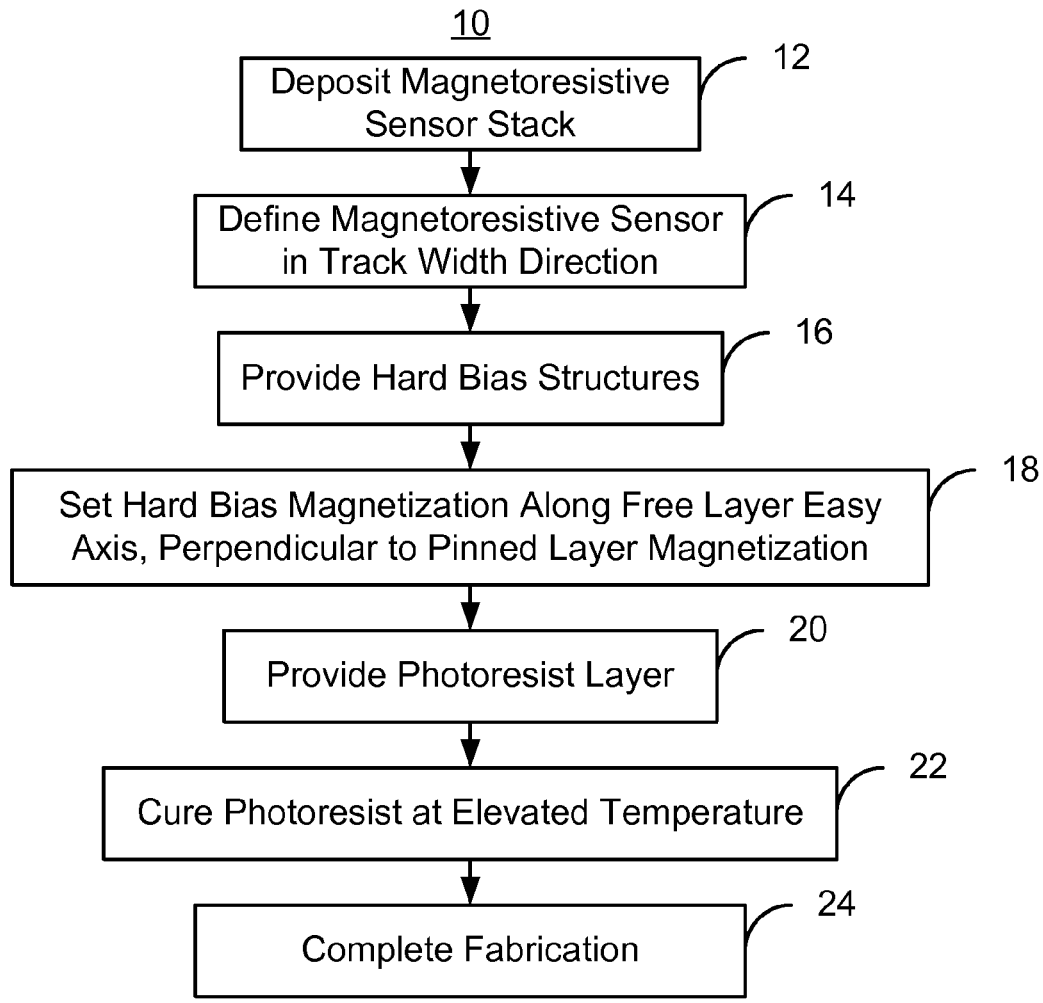
FIG. 1 is a flow chart depicting a conventional method for fabricating a conventional MR sensor.
Figure 2:
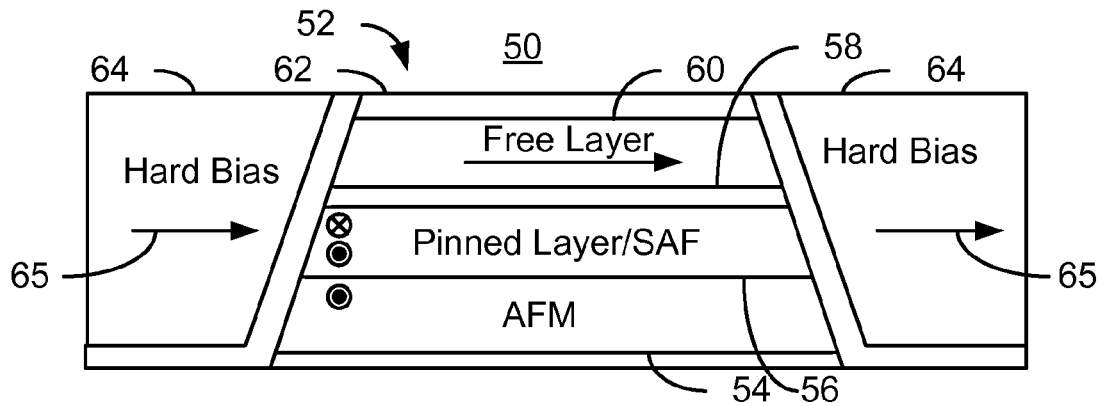
FIG. 2 depicts a conventional MR sensor and associated hard bias structures in a read transducer.
Figure 3:
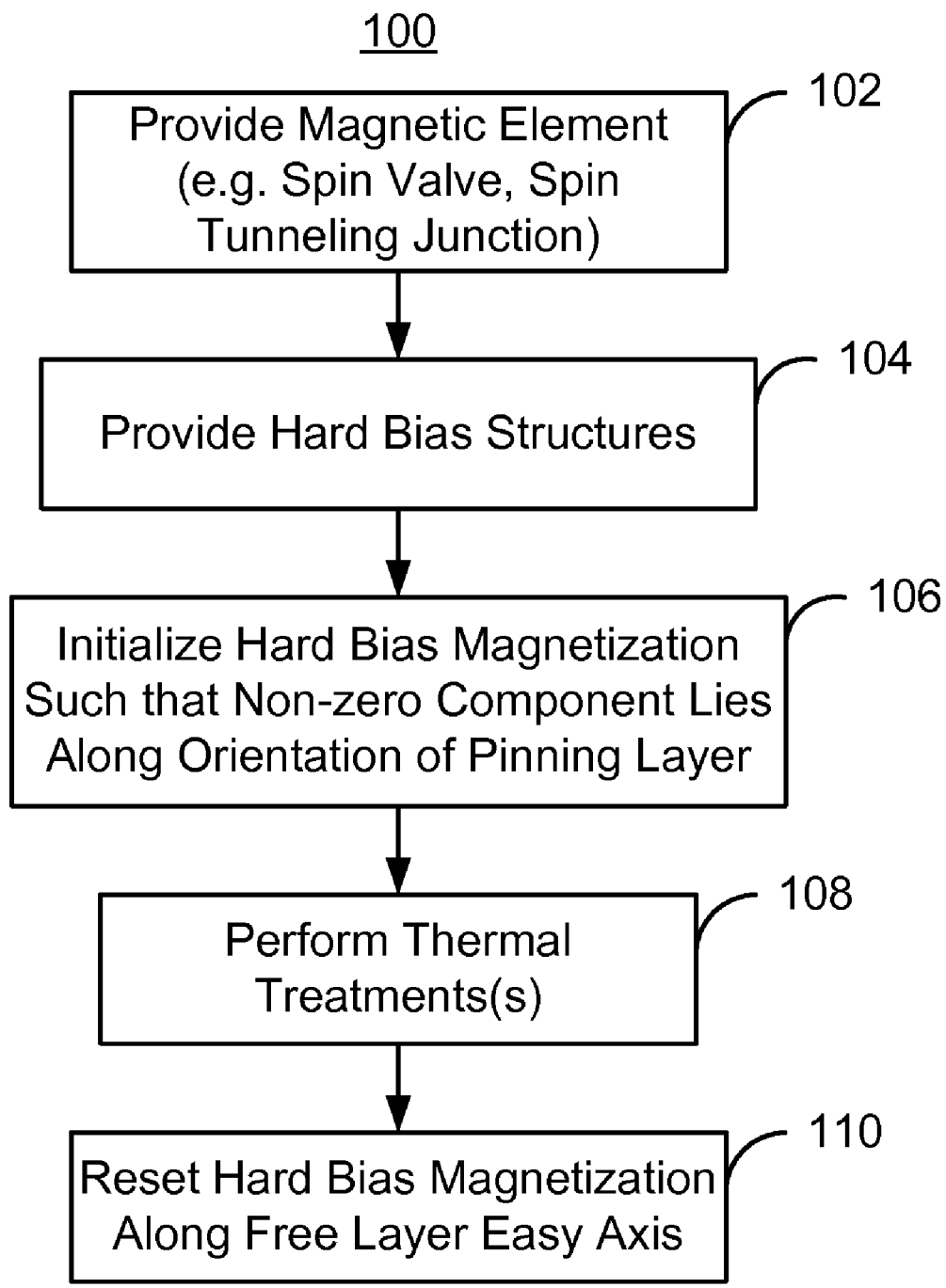
FIG. 3 is a flow chart depicting an exemplary embodiment of a method for fabricating a magnetic transducer having hard bias structures.

Thus, FIG. 3 is a flow chart depicting an exemplary embodiment of a method 100 for fabricating a magnetic transducer. For simplicity, some steps may be omitted. The magnetic transducer being fabricated may be a read transducer and may be part of a merged head that also includes a write transducer and resides on a slider (not shown) in a disk drive. The method 100 also may commence after formation of other portions of the read transducer, such as a shield. The method 100 is also described in the context of providing a single read MR sensor in a single read transducer. However, the method 100 may be used to fabricate multiple transducers at substantially the same time. The method 100 and system are also described in the context of particular layers, such as a capping layer. However, in some embodiments, layers may include multiple sub-layers.

A magnetic element is provided, via step 102. The magnetic element provided may be a read sensor in the read transducer. Thus, the magnetic element may include a free layer, a pinned layer, and a nonmagnetic spacer layer between the free layer and the pinned layer. Also included may be a pinning layer adjacent to the pinned layer. The nonmagnetic spacer layer may be a conductor or a tunneling barrier layer. Thus a magnetic tunneling junction of some sort or a spin valve may be provided. In some embodiments, additional pinned and nonmagnetic spacer layers, for example for a dual spin valve or dual magnetic tunneling junction may be provided. In some embodiments, an additional free layer might also be provided in step 102. The pinning layer is generally desired to be an AFM layer, such as IrMn, and is used to pin the magnetization of the pinned layer in a desired direction. The free layer is configured to be biased in a first direction. This first direction is in plane, or generally within the plane of the layers of the magnetic element and parallel to the ABS. The free layer may be a simple ferromagnetic layer or may be a SAF or other analogous structure. The pinned layer may be a SAF including at least two ferromagnetic layers interleaved with nonmagnetic spacer layer(s). The ferromagnetic layers are generally antiferromagnetically coupled. The ferromagnetic layer closest to the pinning layer is typically aligned parallel to the orientation of the pinning layer. The ferromagnetic layer closest to the free layer is known as the reference layer. Alternatively, the pinned layer might be a simple ferromagnetic layer. The pinned layer magnetization is biased by the pinning layer in a second direction. In some embodiments, the second direction is perpendicular to the first direction. In other embodiments, the second direction may be at another angle with the first direction. The pinning layer is also oriented along the second direction. In one embodiment, the second direction is perpendicular to the ABS. In one embodiment, the ferromagnetic layer closest to the pinned layer is oriented along the second direction. In such an embodiment, the ferromagnetic layer closest to the free layer may be antiparallel to the second direction. Note that magnetizations and orientations of layers are described herein as being in a particular direction or oriented in a particular direction. However, one of ordinary skill in the art will recognize that there is generally some distribution in the magnetization of a particular layer. For example, if a layer is described as having a magnetization in a particular direction, not every magnetic moment of each grain is in that direction. Instead, the distribution of magnetic moments is predominantly in the direction described. For example, the free layer being biased in the first direction means that the magnetic moments of domains in the free layer are primarily in the first direction. In one embodiment, step 102 includes blanket depositing the layers of the magnetic element, providing a mask that covers a portion of the magnetic element, and then etching or ion milling the transducer to define the edge(s) of the magnetic element.

A hard bias structure is provided adjacent to the magnetic element, via step 104. The hard bias structure has a hard bias magnetization. The hard bias is thus desired to have a large coercivity and a high moment. In one embodiment, step 104 includes depositing the hard bias structure while the mask used in providing the magnetic element is in place, then removing the mask. Thus, the hard bias structure is adjacent to the magnetic element. Further, step 104 may include providing a resistive layer between the magnetic element and the hard bias structures, for example for a current-perpendicular-to-plane (CPP) magnetic element.

The hard bias magnetizations are initialized, via step 106. Due to the initialization, the hard bias magnetization has a first component along the first direction in which the free layer is to be biased. For the same reason, the hard bias magnetization also has a second component of the hard bias magnetization being along the second direction, via step 106. In one embodiment, the second direction is perpendicular to the first direction. In other embodiments, the second direction may be at another angle with the first direction. The second component is along the pinned layer magnetizations/pinning layer orientation. In some embodiments, the hard bias magnetizations are initialized such that their the first component is at or near zero. The initialization performed in step 106 may be accomplished by applying a sufficiently large field in the desired direction. In one embodiment, the hard bias magnetization is initialized within thirty degrees of the second direction. In another embodiment, the hard bias magnetization is initialized within ten degrees of the second direction. In one such embodiment, the first component is zero. Thus, the hard bias magnetization may be initialized in the second direction, along the pinned layer magnetizations/pinning layer orientation. For example, the hard bias magnetization may be parallel to the second direction or antiparallel to the pinned layer magnetization(s). Thus, the hard bias magnetization may be set perpendicular to the ABS, pointing outward from the ABS. In another embodiment, the hard bias magnetization may be set perpendicular to the ABS, pointing inward from the ABS. in one embodiment, therefore, the hard bias magnetization would be parallel to the magnetization of the reference layer, while in another embodiment, the hard bias magnetization may be antiparallel to the magnetization of the reference layer.

At least one thermal treatment is performed after the step of initializing the hard bias magnetization, via step 110. The thermal treatment(s) are at one or more temperatures above room temperature. For example, the heat treatment may be at two hundred to two hundred twenty-five degrees centigrade or more for one or more hours in order to cure photoresist or perform other functions. For example, the thermal treatment(s) may include heat treatment(s) for at least one of relieving stress and annealing defects. However, other and/or additional heat treatments for other purposes might be performed.

The hard bias magnetization is reset to the desired direction for operation of the device after the thermal process(es) are performed, via step 110. In one embodiment, this direction is substantially along the first direction. Processing of the transducer may then be continued. For example, contacts configured to drive current through the magnetic element in a CPP direction may be provided. Alternatively, current may be driven through the magnetic element in a current-in-plane (CIP) direction. In some embodiment, the steps 106-110 may be repeated at other points in fabrication of the transducer. For example, steps 106-110 may be used to improve subsequent processing of the device.

Using the method 100, the distribution of the magnetization of the pinned layer may be reduced. Stated differently, the alignment of the ferromagnetic layer(s) of the pinned layer may be less canted, and closer to the desired direction. This is effect is particularly visible where the hard bias magnetizations are aligned with the orientation of the pinned layer. Further it is believed that the pinning layer may be less affected by subsequent high temperature processing. For example, the pinned layer of a SAF in the magnetic element may have a rotation peak at an applied field antiparallel to the pinning direction of at least five thousand Oe. In particular, the hard bias magnetization during fabrication may have a smaller affect on the pinning and pinned layers. Consequently, dispersion in the direction of magnetization of the pinned layer and in the orientation of the pinning layer may be reduced. Thus, the SNR for the magnetic element may be improved.

Figure 4:
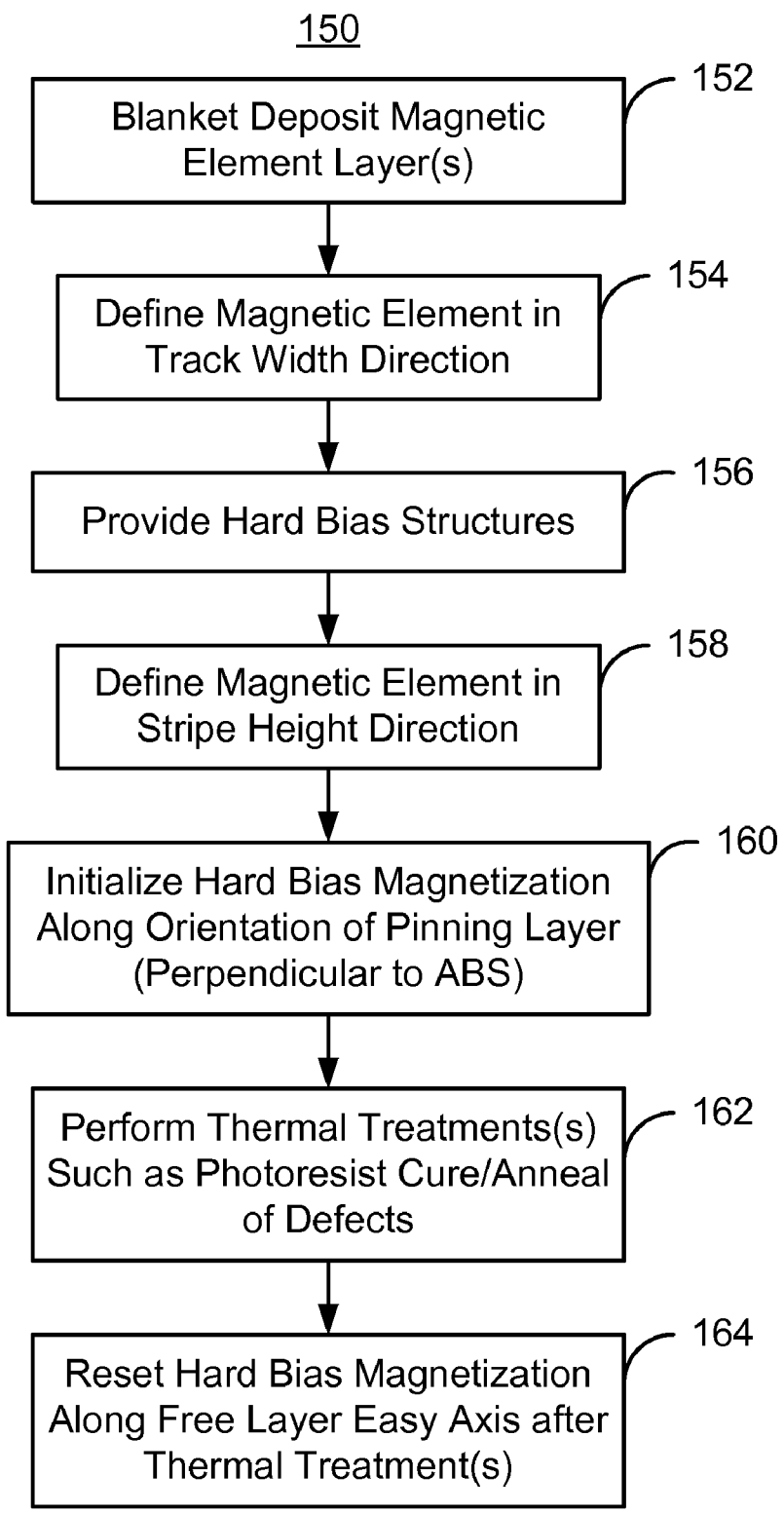
FIG. 4 is a flow chart depicting another exemplary embodiment of a method for fabricating a magnetic transducer having hard bias structures.
Figure 5:
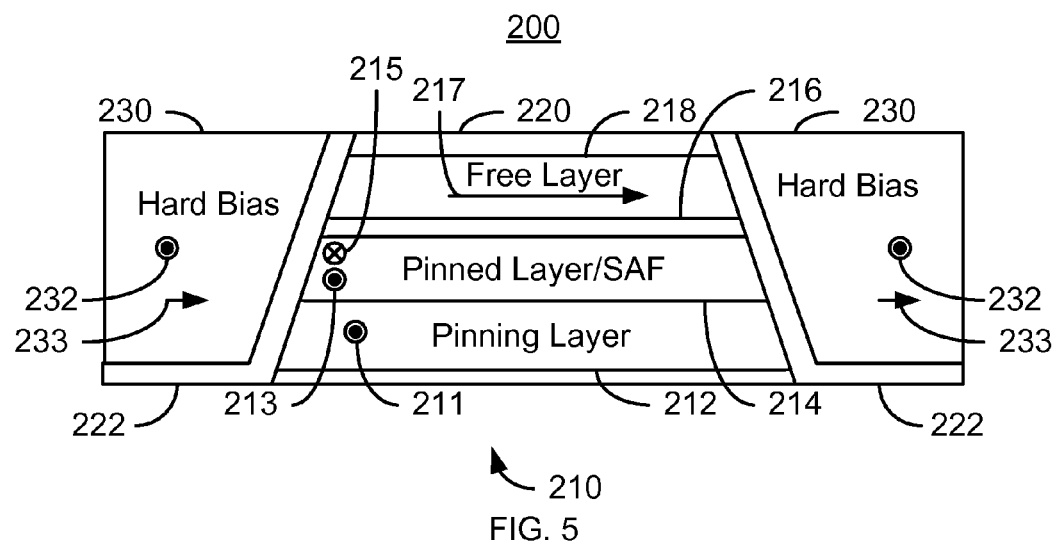
FIG. 5 is a diagram depicting an exemplary embodiment of a transducer during fabrication.
Figure 6:
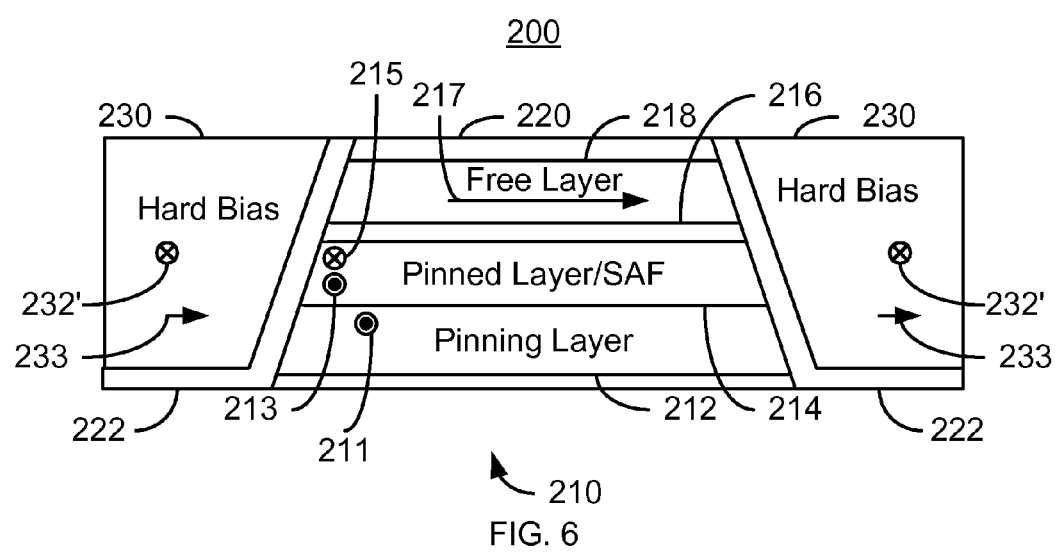
FIG. 6 is a diagram depicting another exemplary embodiment of a transducer during fabrication.
Figure 7:
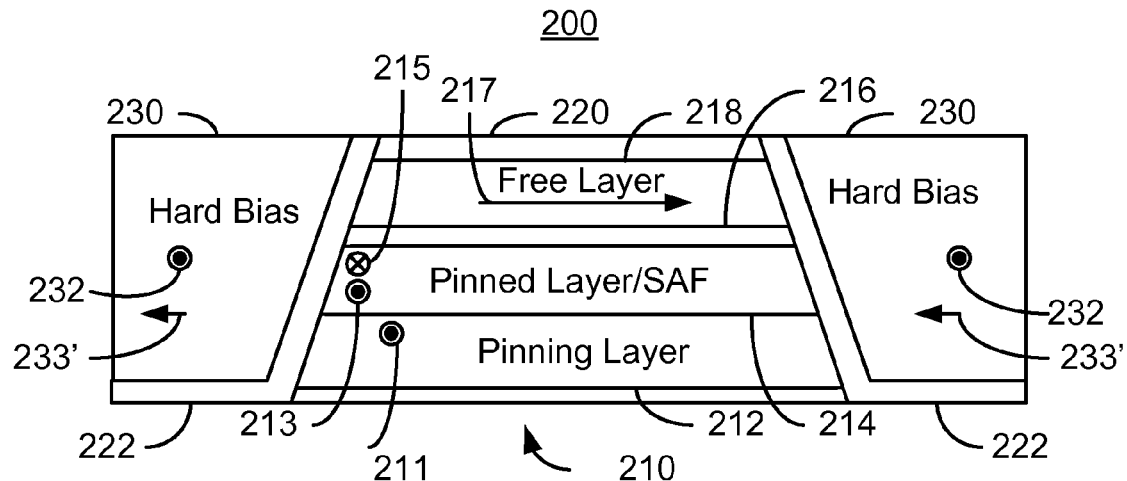
FIG. 7 is a diagram depicting another exemplary embodiment of a transducer during fabrication.
Figure 8:
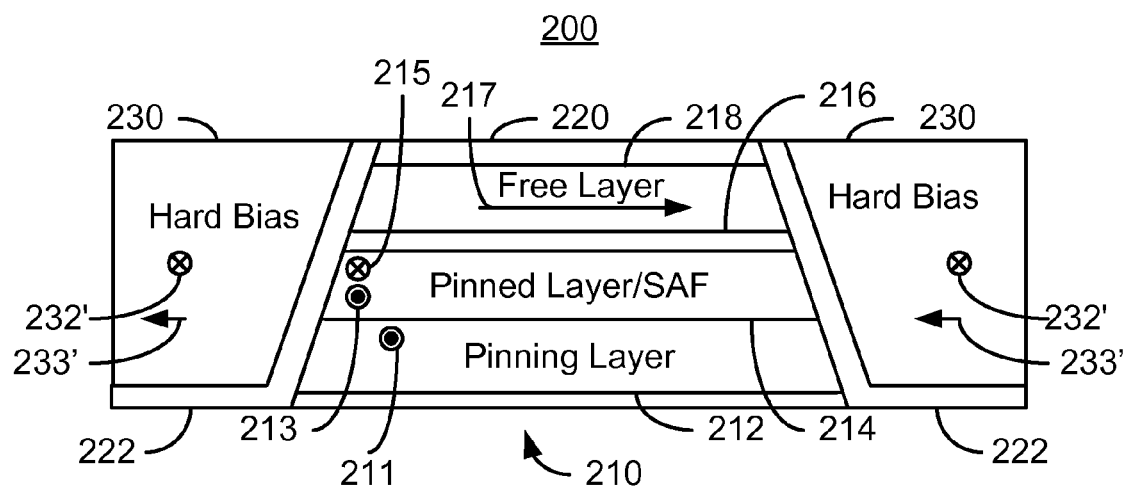
FIG. 8 is a diagram depicting another exemplary embodiment of a transducer during fabrication.

FIG. 4 is a flow chart depicting another exemplary embodiment of a method 150 for fabricating a transducer. For simplicity, some steps may be omitted. FIGS. 5-11 are diagrams depicting an exemplary embodiment of a transducer 200 as viewed from the ABS during fabrication. For clarity, FIGS. 5-11 are not to scale. Referring to FIGS. 4-11, the method 150 is described in the context of the transducer 200. However, the method 150 may be used to form another device (not shown). The transducer 200 being fabricated may be part of a merged head that also includes a write head (not shown) and resides on a slider (not shown) in a disk drive. The method 150 also may commence after formation of other portions of the transducer 200. The method 150 is also described in the context of providing a single magnetic element in a single transducer. However, the method 150 may be used to fabricate multiple transducers and/or multiple magnetic elements at substantially the same time. The method 150 and device 200 are also described in the context of particular layers. However, in some embodiments, such layers may include multiple sub-layers.

The layer(s) for a magnetic element are provided, via step 152. The magnetic element provided may be a read sensor in the read transducer. Step 102 may include blanket depositing materials for a free layer, a pinned layer, a nonmagnetic spacer layer between the free layer and the pinned layer, and a pinning layer. In some embodiments, additional layer(s), such as additional pinned, pinning, nonmagnetic spacer and/or free layers may be provided. These layers are described above with respect to the method 100.

The magnetic element is defined in the track-width direction, via step 154. In one embodiment, step 154 includes providing photoresist and/or hard masks on the portion of the layers from which the magnetic element is desired to be provided. The exposed portions of the magnetic element layer(s) may then be removed, for example via an ion mill. Thus, the magnetic element, which may be a MR read sensor, At least one hard bias structure is provided adjacent to the magnetic element, via step 156. The hard bias structure has a hard bias magnetization. The hard bias is thus desired to have a large coercivity and a high moment. In one embodiment, step 156 includes depositing the hard bias structure while the mask used in defining the magnetic element in the track width direction is in place, then removing the mask. Thus, the hard bias structure is adjacent to the magnetic element. Further, step 156 may include providing a resistive layer between the magnetic element and the hard bias structures, for example for a current-perpendicular-to-plane (CPP) magnetic element. In addition, seed layer(s) for the hard bias material may also be provided. Step 156 may also include lifting off the mask used in defining the magnetic element in step 154.

The magnetic element may then be defined in the stripe height direction, via step 158. Step 158 may include masking the region of the magnetic transducer in the area of the ABS. The mask would extend at least a distance equal to the stripe height in a direction perpendicular to the ABS.

The hard bias magnetization is initialized, via step 160. Step 160 is performed by applying a large magnetic field in the direction that the hard bias structures are desired to be magnetized during fabrication. In one embodiment, a field of at least one Tesla.

FIGS. 5-10 depict various embodiments of a transducer 200 after step 160 is performed. The transducer 200 includes a magnetic element 210, which may be a GMR read sensor. The magnetic element includes a pinning layer 212, pinned layer 214, capping layer 216, free layer 218, and capping layer. In the embodiment shown, the pinning layer 212 is an AFM layer with orientation 211, perpendicular to the ABS. The pinned layer 214 shown is a SAF. Consequently, magnetizations 213 and 215 of the layers closest to the pinning layer 211 (also termed a pinned layer for the SAF) and the reference layer (closest to the free layer 218), respectively, are shown. The free layer desired magnetization 217 is also shown. Thus, the easy axis for the free layer 218 is in plane. Thus, the pinned layer 216 and pinning layer 212 are oriented perpendicular to the ABS, while the desired free layer magnetization 217 is in plane and has an equilibrium position parallel to the ABS. Also shown are insulating layers 222 and hard bias structures 230. Thus, in the embodiment shown, the magnetic element 210 is a CPP structure. However, in another embodiment, a CIP structure might be used. FIGS. 5-10 depict various ways in which the hard bias magnetization might be initialized. The hard bias magnetization is oriented such that it has a component in a first direction, along the desired free layer magnetization 217, and a second component in a second direction along the orientation of the pinning layer 212. Thus, the second component is perpendicular to the ABS in the embodiments shown. In some embodiments, the hard bias structures 230 may have a component of their magnetizations in a third direction, perpendicular to the plane of the layers (e.g. up/down as shown in FIGS. 5-10). However, it is desirable for such a component to be small or zero. In the embodiment shown in FIG. 5, the hard bias magnetization has a component 232 out of plane of the page (parallel to the pinning layer orientation and the magnetization 213 of the pinned layer of the SAF, antiparallel to the magnetization 215 of the reference layer), and magnetization component 233 parallel to the desired free layer magnetization 217. However, it is desirable for the component 233 to be small or zero. In the embodiment shown in FIG. 6, the hard bias magnetization has a component 232' into the plane of the page (antiparallel to the pinning layer orientation and the magnetization 213, parallel to the magnetization 215 of the reference layer), and magnetization component 233 parallel to the desired free layer magnetization 217. However, it is desirable for the component 233 to be small or zero. In the embodiment shown in FIG. 7, the hard bias magnetization has a component 232 out of plane of the page (parallel to the pinning layer orientation and the magnetization 213, antiparallel to the magnetization 215 of the reference layer), and magnetization component 233' antiparallel to the desired free layer magnetization 217. However, it is desirable for the component 233' to be small or zero. In the embodiment shown in FIG. 8, the hard bias magnetization has a component 232' into the plane of the page (antiparallel to the pinning layer orientation and the magnetization 213, parallel to the magnetization 215 of the reference layer), and magnetization component 233' antiparallel to the desired free layer magnetization 217. However, it is desirable for the component 233' to be small or zero.

Figure 9:
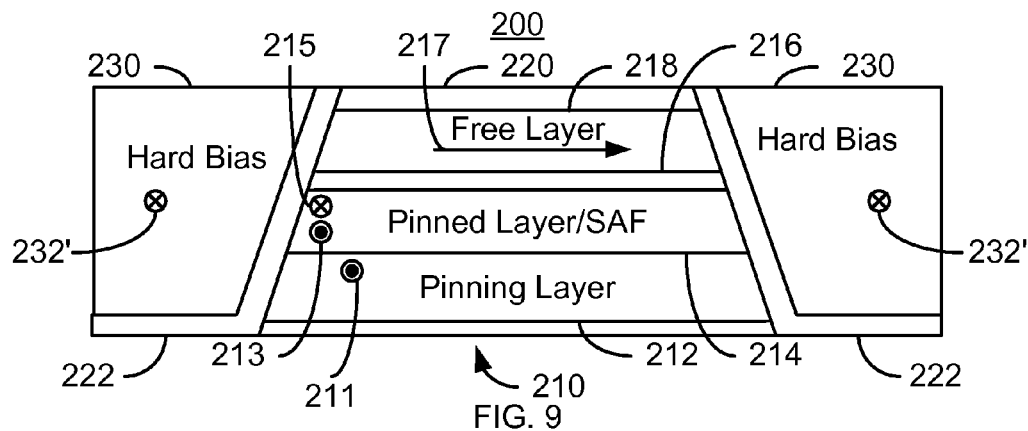
FIG. 9 is a diagram depicting another exemplary embodiment of a transducer during fabrication.
Figure 10:
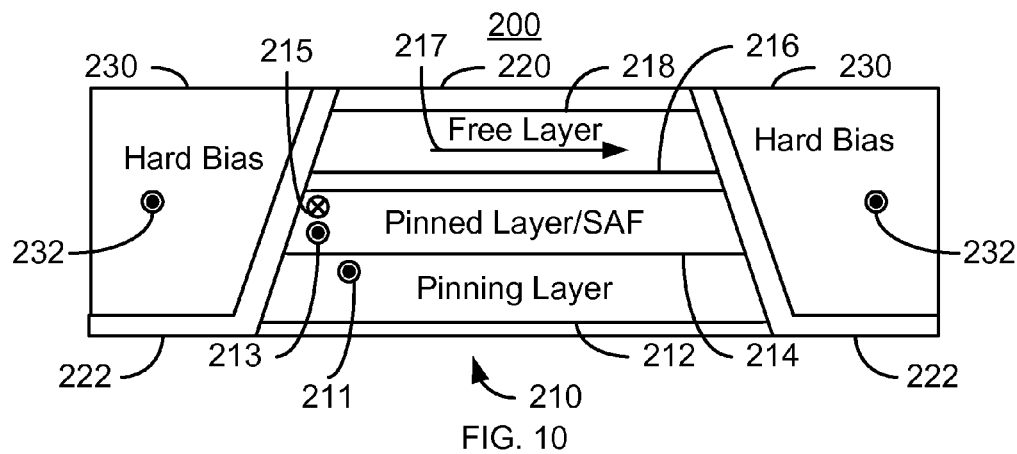
FIG. 10 is a diagram depicting another exemplary embodiment of a transducer during fabrication.

In the embodiment shown in FIG. 9, the hard bias magnetization has a component 232' into the plane of the page (antiparallel to the pinning layer orientation and the magnetization 213, parallel to the magnetization 215 of the reference layer). Thus, the magnetizations of the hard bias structures 230 are substantially perpendicular to the ABS and parallel to the magnetization 215 of the reference layer. In the embodiment shown in FIG. 10, the hard bias magnetization has a component 232 out of the plane of the page (parallel to the pinning layer orientation and the magnetization 213, antiparallel to the magnetization 215 of the reference layer). Thus, the magnetization of the hard bias structures 230 are substantially perpendicular to the ABS and parallel to the magnetization 213 of the ferromagnetic layer closest to the pinning layer 212.

Note that FIGS. 5-10 depict various ways in which the hard bias magnetization might be initialized based on the magnetization 217 of the free layer 218, the magnetizations 213 and 215 of the ferromagnetic layers of the pinned layer 216 and the orientation 211 of the pinning layer 212. However, the hard bias structures 230 may be biased in another manner if these magnetizations change. In general, it is desirable for the hard bias structures 230 to be initialized parallel or antiparallel to the orientation of the pinning layer 212/the magnetization(s) 213 and 215 of the pinned layer and perpendicular to the desired magnetization 217 of the free layer 218.

At least one thermal treatment is performed after the step of initializing the hard bias magnetization, via step 162. The thermal treatment is at least one temperature above room temperature. For example, the heat treatment may be at two hundred to two hundred twenty-five degrees centigrade or more for one or more hours in order to cure photoresist. For example, the thermal treatment(s) may include heat treatment(s) for at least one of relieving stress and annealing defects. However, other and/or additional heat treatments for other purposes might be performed.

Figure 11:
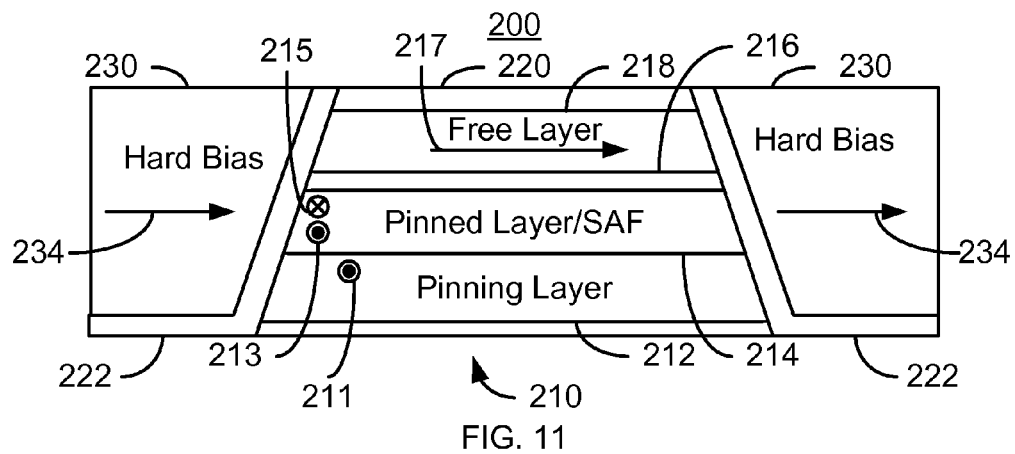
FIG. 11 is a diagram depicting another exemplary embodiment of a transducer during fabrication.

The hard bias magnetizations are reset to the desired direction for operation of the device after the thermal process(es) are performed, via step 164. In one embodiment, this direction is substantially along the desired magnetization 217. FIG. 11 depicts that transducer 200 after step 164 is performed. Thus, the hard bias magnetization 234 is in the direction of the free layer magnetization 217. Processing of the transducer may then be completed. For example, contacts configured to drive current through the magnetic element in a CPP direction may be provided. Alternatively, current may be driven through the magnetic element in a CIP direction. In some embodiment, the steps 160-164 may be repeated at other points in fabrication of the transducer. For example, steps 160-164 may be used to improve subsequent processing of the device.

Using the method 150, the distribution of the magnetization of the pinned layer may be reduced. Stated differently, the alignment of the ferromagnetic layer(s) of the pinned layer may be less canted, and closer to the desired direction. It is believed that the dispersion magnetization direction in the pinned layer 216 and/or pinning layer 212 is reduced the most for the embodiment shown in FIG. 9, where the hard bias is initialized in the direction of the magnetization 215 of the reference layer. It is also believed that the next best reduction in dispersion is for the embodiment shown in FIG. 10, where the hard bias 230 is initialized antiparallel to the direction of magnetization 215 of the reference layer. Further it is believed that the pinning layer 212 and pinned layer 216 may be less affected by subsequent processing. For example, the pinned layer of the SAF 214 in the magnetic element 210 may have a rotation peak at an applied field antiparallel to the pinning direction of at least five thousand Oe. In particular, the hard bias magnetization may have a smaller effect on the pinning and pinned layers. Consequently, the SNR for the magnetic element may be improved.

We claim:

1. A method for providing a magnetic transducer comprising:
   providing a magnetic element including a free layer, a pinned layer, a nonmagnetic spacer layer between the free layer and the pinned layer, and a pinning layer adjacent to the pinned layer, the free layer being configured to be biased in a first direction, the pinned layer having a pinned layer magnetization biased by the pinning layer in a second direction, the pinning layer oriented along the second direction;
   providing a hard bias structure adjacent to the magnetic element and having a hard bias magnetization;
   initializing the hard bias magnetization such that a first component of the hard bias magnetization is along the first direction, a second component of the hard bias magnetization being along the second direction, the second component being nonzero;
   performing at least one thermal treatment after the step of initializing the hard bias magnetization, the at least one thermal treatment being at least one temperature above room temperature; and
   resetting the hard bias magnetization substantially along the first direction after the at least one thermal process is performed.

2. The method of claim 1 wherein the first component and the second component of the hard bias magnetization are such that the hard bias magnetization is initialized within thirty degrees of the second direction.

3. The method of claim 2 wherein the first component and the second component of the hard bias magnetization are such that the hard bias magnetization is initialized within ten degrees of the second direction.

4. The method of claim 3 wherein the first component is zero.

5. The method of claim 1 wherein the magnetic transducer includes an air-bearing surface (ABS) and wherein the step of initializing the hard bias magnetization further includes:
   setting the hard bias magnetization perpendicular to the ABS.

6. The method of claim 5 wherein the magnetic element has a stripe height perpendicular to the ABS and in a third direction antiparallel to the second direction and wherein the step of initializing the hard bias magnetization further includes:
   setting the hard bias magnetization parallel to the second direction.

7. The method of claim 5 wherein the magnetic element has a stripe height perpendicular to the ABS and in a third direction antiparallel to the second direction and wherein the step of initializing the hard bias magnetization further includes:
   setting the hard bias magnetization antiparallel to the second direction.

8. The method of claim 1 wherein the pinned layer includes a first ferromagnetic layer adjoining the pinning layer, a second ferromagnetic layer, and a spacer layer between the first ferromagnetic layer and the second ferromagnetic layer, the first ferromagnetic layer having a first magnetization parallel to the second direction, the second ferromagnetic layer having a second magnetization antiparallel to the second direction, and wherein the step of initializing the hard bias magnetization further includes:
   setting the hard bias magnetization parallel to the second direction.

9. The method of claim 1 wherein the pinned layer includes a first ferromagnetic layer adjoining the pinning layer, a second ferromagnetic layer, and a spacer layer between the first ferromagnetic layer and the second ferromagnetic layer, the first ferromagnetic layer having a first magnetization parallel to the second direction, the second ferromagnetic layer having a second magnetization antiparallel to the second direction, and wherein the step of initializing the hard bias magnetization further includes:
   setting the hard bias magnetization antiparallel to the second direction.

10. The method of claim 1 further comprising:
   providing a photoresist layer.

11. The method of claim 10 wherein the step of performing at least one thermal treatment further includes:
   curing the photoresist layer.

12. The method of claim 1 wherein the at least one thermal treatment further includes a heat treatment for at least one of relieving stress and annealing defects.

13. The method of claim 1 wherein the magnetic element includes an additional nonmagnetic spacer layer and an additional pinned layer, the additional nonmagnetic spacer layer residing between the additional pinned layer and the free layer.

14. The method of claim 13 wherein the magnetic element further includes an additional free layer, the additional free layer residing between the additional nonmagnetic spacer layer and the free layer.

15. The method of claim 1 wherein the nonmagnetic spacer layer includes at least one of a tunneling barrier layer and a conductive layer.

16. The method of claim 1 further comprising:
   providing at least one contact configured to drive current through the magnetic element in a current-perpendicular-to-plane direction.

17. The method of claim 1 further comprising:
   providing at least one contact configured to drive current through the magnetic element in a current-in-plane direction.

18. The method of claim 1 wherein the second direction is perpendicular to the first direction.

* * * * *